United States Patent [19]

Matsugu et al.

[11] Patent Number: 5,235,408
[45] Date of Patent: Aug. 10, 1993

[54] POSITION DETECTING METHOD AND APPARATUS

[75] Inventors: Masakazu Matsugu, Atsugi; Kenji Saitoh; Shigeyuki Suda, both of Yokohama, all of Japan

[73] Assignee: Canon Kabushiki Kaisha, Tokyo, Japan

[21] Appl. No.: 888,434

[22] Filed: May 28, 1992

Related U.S. Application Data

[63] Continuation of Ser. No. 746,175, Aug. 15, 1991, abandoned, which is a continuation of Ser. No. 401,867, Sep. 1, 1989, abandoned.

[30] Foreign Application Priority Data

Sep. 5, 1988 [JP] Japan .................. 63-221587
Aug. 14, 1989 [JP] Japan .................. 1-209925

[51] Int. Cl.$^5$ .................................. G01B 11/00
[52] U.S. Cl. ................................. 356/401; 250/548
[58] Field of Search .................... 356/399-401, 356/153, 154, 354, 356; 250/548, 557, 237 G; 355/53

[56] References Cited

U.S. PATENT DOCUMENTS

| | | |
|---|---|---|
| 4,037,969 | 7/1977 | Feldman et al. |
| 4,311,389 | 1/1982 | Fay et al. .................. 356/400 |
| 4,326,805 | 4/1982 | Feldman et al. |
| 4,514,858 | 4/1985 | Novak . |
| 4,815,854 | 3/1989 | Tanaka et al. .................. 356/356 |
| 5,000,573 | 3/1991 | Suzuki et al. .................. 356/400 |
| 5,114,235 | 5/1992 | Suda et al. .................. 356/401 |

FOREIGN PATENT DOCUMENTS 56-157033 12/1981 Japan .

Primary Examiner—Richard A. Rosenberger
Assistant Examiner—Hoa Q. Pham
Attorney, Agent, or Firm—Fitzpatrick, Cella, Harper & Scinto

[57] ABSTRACT

A device for detecting a positional relationship between a mask and a wafer, includes a light source for projecting light toward the mask, a first photodetecting system for detecting the position, on a predetermined plane, of first light deflected by the mask and the wafer, wherein the position of incidence on the first photodetecting system of the first light is changeable with the positional relationship between the mask and the wafer, a second photodetecting system for detecting the position, on a predetermined plane, of incidence of second light deflected by the mask, wherein the position of incidence on the second photodetecting system, of the second light being changeable with relative inclination between the mask and the light source, and a position detecting system for detecting the relative position of the mask and the wafer on the basis of the detection by the first and second photodetecting systems, wherein the detection by the position detecting system can be free from the relative inclination between the mask and the light source.

32 Claims, 12 Drawing Sheets

POSITION DETECTING METHOD AND APPARATUS

This application is a continuation of application Ser. No. 07/746,175 filed Aug. 15, 1991, now abandoned, which in turn is a continuation application of Ser. No. 07/401,867 filed Sep. 1, 1989, now abandoned.

FIELD OF THE INVENTION AND RELATED ART

This invention relates generally to a position detecting method and apparatus suitably usable, for example, in a semiconductor microcircuit device manufacturing exposure apparatus for lithographically transferring a fine electronic circuit pattern formed on the surface of a first object (original) such as a mask or reticle (hereinafter simply "mask") onto the surface of a second object (workpiece) such as a wafer, for relative positioning or aligning the mask and the wafer.

In exposure apparatuses for use in the manufacture of semiconductor devices, the relative alignment of a mask and a wafer is one important factor for ensuring improved performance. Particularly, as for alignment systems employed in recent exposure apparatuses, submicron alignment accuracies or more strict accuracies are required in consideration of the demand for a higher degree of integration of semiconductor devices.

In many types of alignment systems, features called "alignment patterns" are provided on a mask and a wafer and, by utilizing positional information obtainable from these patterns, the mask and wafer are aligned. As for the manner of executing the alignment, as an example there is a method wherein the amount of relative deviation of these alignment patterns is detected on the basis of image processing. Another method is proposed in U.S. Pat. Nos. 4,037,969 and 4,514,858 and Japanese Laid-Open Patent Application, Laid-Open No. Sho 56-157033, wherein so-called zone plates are used as alignment patterns upon which light is projected and wherein the positions of light spots formed on a predetermined plane by lights from the illuminated zone plates are detected.

Generally, an alignment method utilizing a zone plate is relatively insensitive to any defect in the alignment pattern and therefore assures relatively high alignment accuracies, as compared with an alignment method simply using a traditional alignment pattern.

FIG. 1 is a schematic view of a known type alignment system utilizing zone plates.

In FIG. 1, parallel light emanating from a light source 72 passes through a half mirror 74 and is focused at a point 78 by a condensing lens 76. Thereafter, the light illuminates a mask alignment pattern 68a on a mask 68 and an alignment pattern 60a on a wafer 60 which is placed on a support table 62. Each of these alignment patterns 68a and 60a is provided by a reflection type zone plate and functions to form a spot of focused light on a plane perpendicular to an optical axis which contains the point 78. The amount of relative deviation of the positions of these light spots formed on that plane is detected, by directing the focused beams to a detection plane 82 by means of the condensing lens 76 and another lens 80.

In accordance with an output signal from the detector 82, a control circuit 84 actuates a driving circuit 64 to relatively align the mask 68 and the wafer 60.

FIG. 2 illustrates an imaging relationship of lights from the mask alignment pattern 68a and the wafer alignment pattern 60a shown in FIG. 1.

In FIG. 2, a portion of the light divergently advancing from the point 78 is reflectively diffracted by the mask alignment pattern 68a and forms a spot 78a of focused light at or adjacent to the point 78, the spot representing the mask position. Another portion of the light passes through the mask 68 in the form of a zero-th order transmission light and is projected upon the wafer alignment pattern 60a on the wafer 60 surface with its wavefront being unchanged. The incident light is reflectively diffracted by the wafer alignment pattern 60a and then passes again through the mask 68 in the form of a zero-th order transmission light, and finally is focused in the neighborhood of the point 78 to form a spot 78b of focused light, representing the wafer position. In the illustrated example, when the light diffracted by the wafer 60 forms a spot, the mask 68 functions merely as a transparent member.

The position of the spot 78b formed by the wafer alignment pattern 60a in the described manner represents a deviation $\Delta\sigma'$, in the plane perpendicular to the optical axis containing the point 78, of an amount corresponding to the amount of deviation $\Delta\sigma$ of the wafer 60 with respect to the mask 68.

In this method, however, there are some disadvantages an example of which is that If an alignment head which is a casing that accommodates therein a light source for producing an alignment light (light to be used for the alignment) is inclined or rotationally displaced relative to the mask surface, the angle of incidence of the alignment light upon the mask surface changes, which causes displacement of the position of the center of gravity of the light upon the sensor surface. Disadvantageously, this necessitates correction of any error component due to relative inclination or rotation of the alignment head and the mask surface, in order to the ensure accurate alignment.

SUMMARY OF THE INVENTION

It is an object of the present invention to provide a position detecting method and apparatus which assures high-precision position detection without being affected by any relative inclination or rotation of an alignment head and a mask surface.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Figure 1:
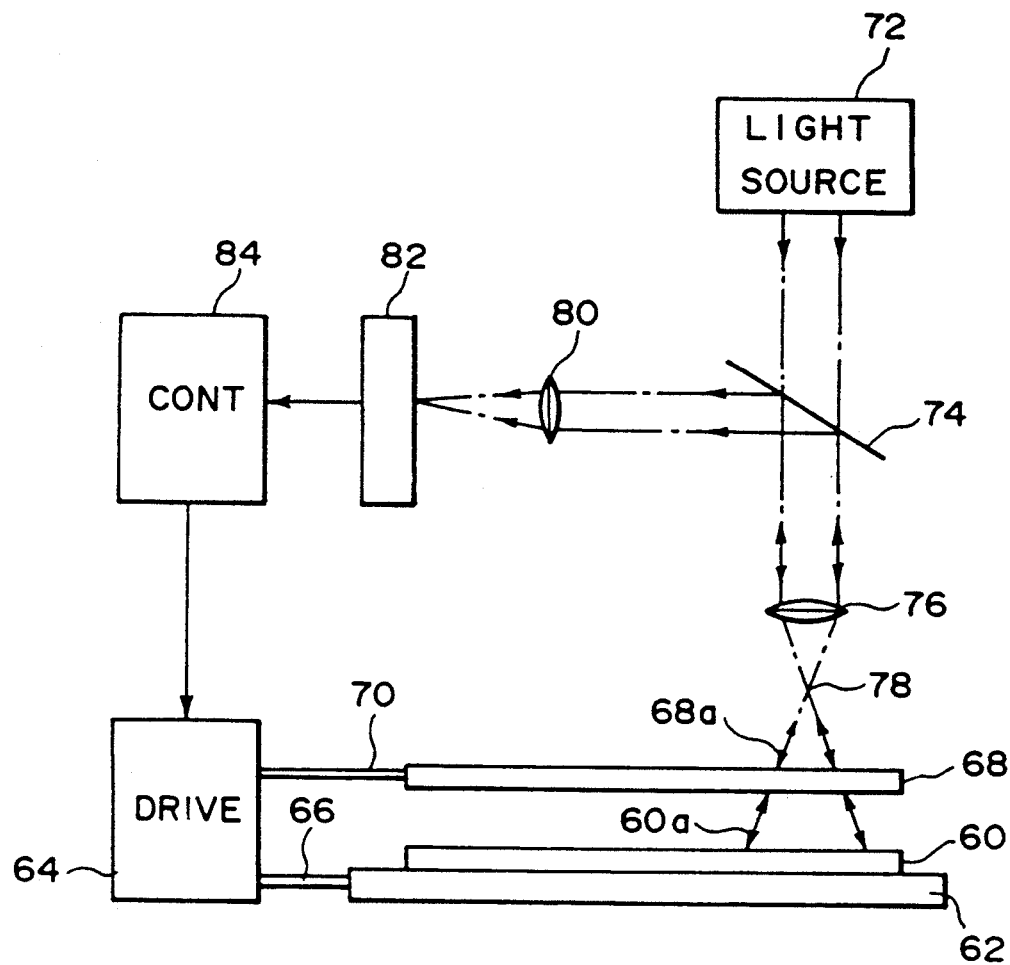
FIGS. 1 and 2 are schematic representations, illustrating a known type alignment system.
Figure 2:
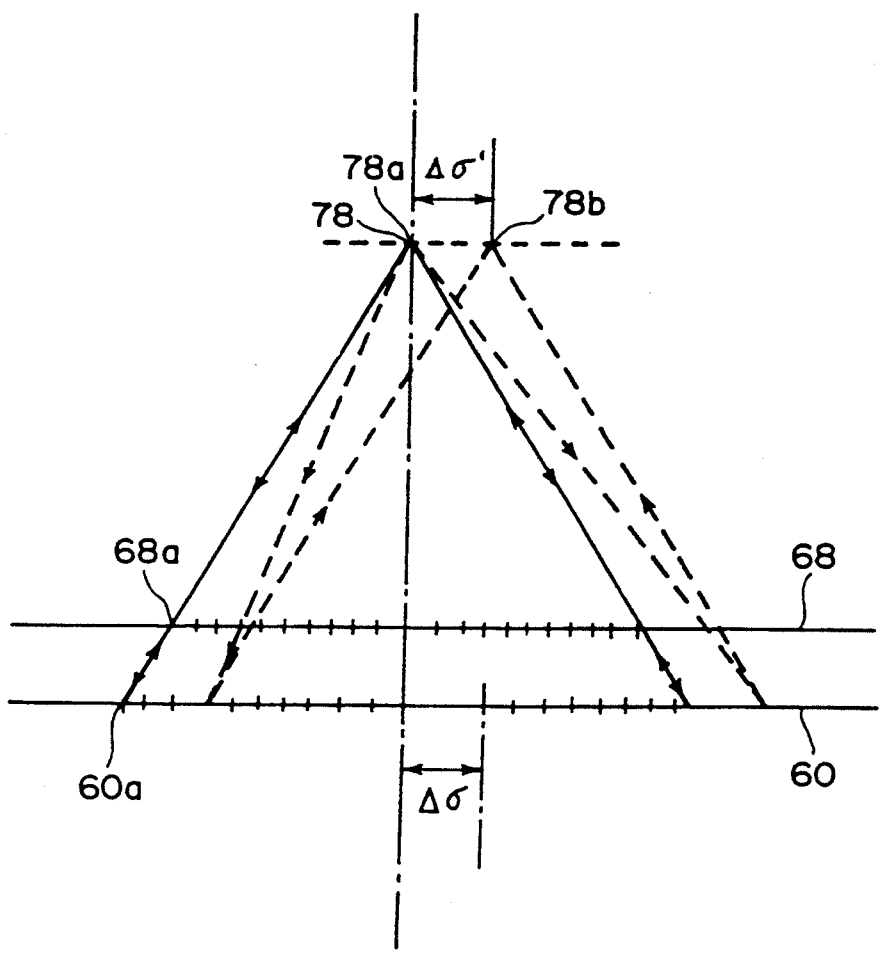
Figure 3A:
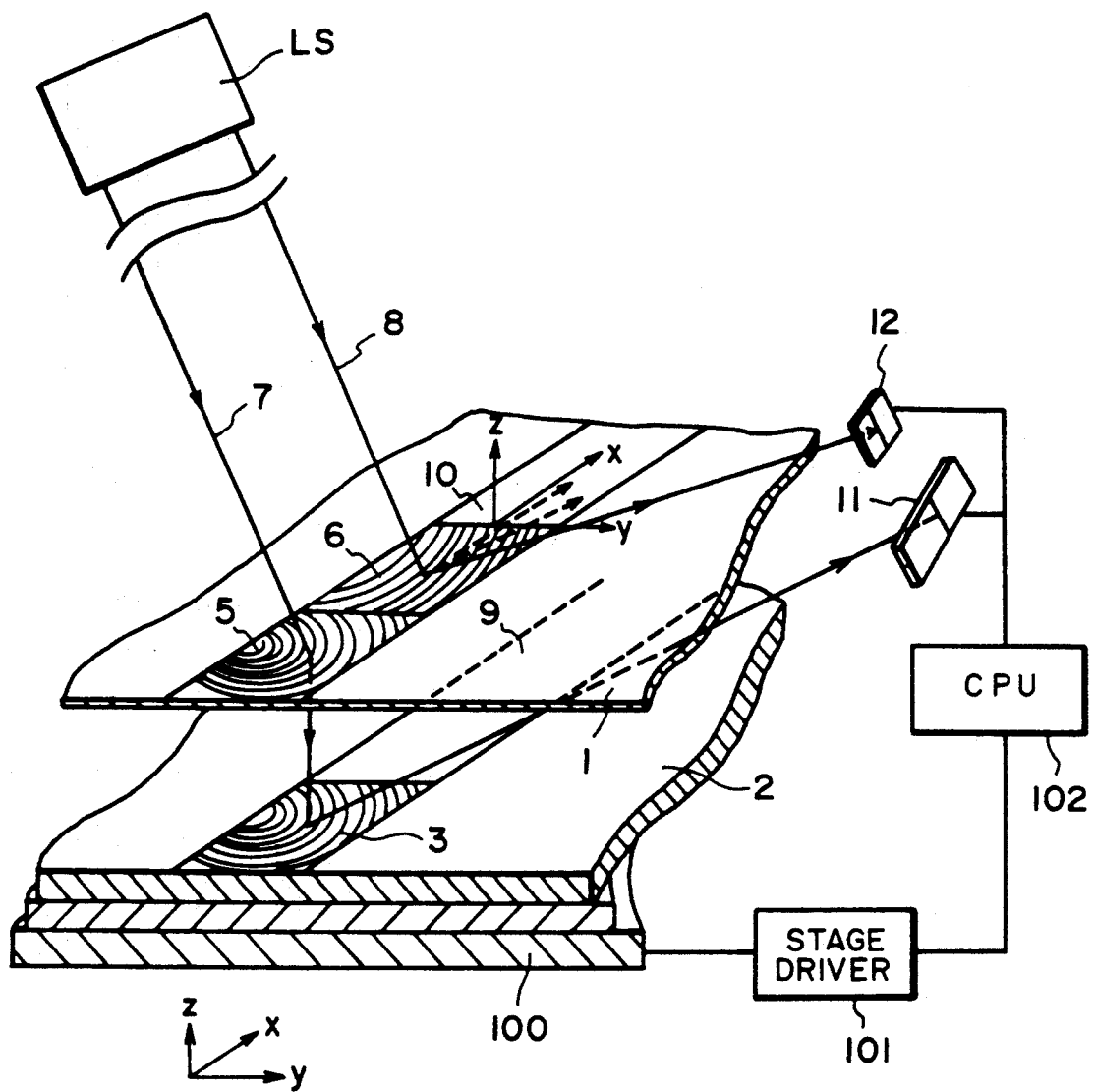
FIG. 3A is a perspective view schematically and diagrammatically showing a major part of a first embodiment of the present invention.

Referring now to FIG. 3A which is a schematic view showing a major portion of a first embodiment of the present invention, a first object 1 is a mask, for example, and a second object 2 is a wafer, for example, which is to be aligned with the mask 1. First and second alignment marks 5 and 3 are provided on the mask 1 surface and the wafer 2 surface, respectively, for obtaining alignment light. Denoted at 6 is a reference mark for obtaining a reference light, which mark is provided on the mask 1 surface (that serves as a reference surface, in this embodiment) at a position adjacent to the first alignment mark 5. The first and second alignment marks 3 and 5 and the reference mark 6 each is formed by a grating lens such as a Fresnel zone plate, for example. These marks are provided on scribe lines 9 and 10, respectively, which are defined on the mask 1 surface and the wafer 2 surface, respectively. Alignment light (signal light) 7 and reference light 8 emanate from a light source LS accommodated in an alignment head which is not shown. Each of these lights is collimated substantially into a parallel light of a predetermined beam diameter, by means of a projecting lens system (not shown). The lights 7 and 8 are in the form of a single or combined bundle when emitted from the light source, and they are separated by the alignment marks 5 and 6.

In this embodiment, examples that can be used as a light source are: a light source such as a semiconductor laser, an He-Ne laser, an Ar laser or other laser that can emit a coherent light; and a light source such as a light-emitting diode or other light source that can emit an incoherent light. Sensors (photoreceptors) 11 and 12 function as first and second detecting means, respectively, and are adapted to receive the alignment light 7 and the reference light 8, respectively. Each of these sensors may comprise a one-dimensional CCD sensor, for example. The one-dimensional CCD sensor is disposed so that the direction in which its sensing elements are arrayed is correlated with the direction with respect to which any positional deviation is to be detected. Denoted at 100 is an X-Y stage; denoted at 101 is a stage driver; and denoted at 102 is a central processing unit (CPU).

In this embodiment, the alignment light 7 and the reference light 8 are incident upon the first alignment mark 5 and the reference mark 6, respectively, on the mask 1 surface, each at a predetermined angle. Of these lights, the alignment light 7 is transmissively diffracted by the first alignment mark 5 and then is reflectively diffracted by the second alignment mark 3 on the wafer 2 surface and, finally, is projected on the sensor 11 surface. By using this sensor 11, the position of the center of gravity of the light intensity distribution of the alignment light incident on the sensor surface is detected and then, by using an output signal from the sensor 11, the mask 1 and the wafer 2 can be aligned with each other.

Here, the term "center of gravity of the intensity distribution of light" means such a point that, when in the cross-section of the light a position vector of each point in the section is multiplied by the light intensity of that point and the thus obtained products are integrated over the entire section, the integrated value has a "zero vector". Alternatively, the position of the peak point in the light intensity may be used as a representative.

On the other hand, the reference light 8 incident on the reference mark 6 on the first object 1 surface is reflectively diffracted by the reference mark 6. Of the diffracted rays, the reflectively diffracted light of a predetermined order or orders is converged on the sensor 12 surface. By detecting the point of incidence upon the sensor 12 surface, the angle of incidence of the reference light 8 on the reference mark 6 is detected. Thus, the positional relationship between the alignment head and the mask 1 surface, which is used as a reference surface, is obtained.

A description will now be provided of the first and second alignment marks 5 and 3 and of the reference mark 6 used in this embodiment.

The alignment marks 3 and 5 and the reference mark 6 are provided by Fresnel zone plates (or grating lenses) having different focal lengths. Each mark has a size of 140 microns in the lengthwise direction of the scribe line and 50 microns in the widthwise direction (y direction) of the scribe line.

In this embodiment, the alignment light 7 is incident on the mask 1 at an angle of incidence of 10 degrees, with the projection component upon the mask 1 surface being perpendicular to the scribe line direction (x direction).

The alignment light 7 incident on the mask 1 with a predetermined angle is influenced by the lens function of the grating lens (first alignment mark) 5 and is transformed into a convergent or divergent light which is emitted from the mask 1 so that its chief ray has a predetermined angle with respect to the normal of the mask 1.

The alignment light 7 having been transmissively diffracted by the first alignment mark 5 is focused at a point of distance a 238.0 microns from the mark, vertically below the wafer 2 surface. The alignment mark 5, in this case, has a focal length of 238 microns. Also, the mask 1 and the wafer 2 are spaced apart by a distance 30 microns.

The light transmissively diffracted by the alignment mark 5 is influenced by a concave or convex lens function of the second alignment mark 3 on the wafer 2 surface, and is collected on the sensor 11 surface (first detecting means).

When the wafer 2 shifts in the X direction relative to the mask 1, which is fixed to the apparatus, the grating lenses 5 and 3 of the mask and the wafer are brought into misalignment like the case where the coaxial relationship of lenses of an optical system is destroyed. As a result, the angle of emission of the emanating light changes. This change causes displacement of the position of incidence of the light upon the light receiving surface in the X direction, by an amount corresponding to the relative deviation of the mask and the wafer in the X direction. In this embodiment, the detector comprises a CCD line sensor having sensing elements arrayed in the X direction. Where the relative deviation of the mask 1 and the wafer 2 is not so large, the amount of displacement of the light spot in the X direction is proportional to the amount of relative deviation of the mask and the wafer in the X direction.

Assuming now that the mask and the wafer deviate relative to each other in the X direction by an amount $\Delta\sigma$; that the distance from the wafer 2 to the point of convergence (or the origin of divergence) of the light having been converged (or diverged) by the grating lens 5 of the mask 1, is denoted by a; and that the distance from the wafer 2 to the light receiving surface is denoted by b, then the displacement $\Delta\delta$ of the center of gravity of the light upon the light receiving surface can be expressed as follows:

$$\Delta\delta = \Delta\sigma x \, (b/a+1) \qquad (a)$$

That is, the displacement $\Delta\delta$ of the center of gravity is of an amount magnified with a magnification "b/a+1".

On the other hand, the angle of emission of the light emanating from the reference mark 6 of the mask does not change even with any positional deviation between the mask and the wafer, and therefore it is used as a reference light. The position of the center of gravity of such reference light upon the sensor 12 is detected and, on the other hand, the position on the sensor 11 of the center of gravity of the alignment light incident on the sensor 11 is detected. Then, the interval between these positions in the X direction is measured. The measured interval is compared with a reference interval which is the interval in the X-direction between the gravity centers of these two lights as assumed when the mask and the wafer have no relative positional deviation. From the comparison, an error $\Delta\delta$ is obtainable. The thus obtained error $\Delta\delta$ is substituted into equation (a), whereby the deviation $\Delta\sigma$ can be determined. The reference interval can be determined in preparation, for example, geometo-optically from design values of the marks.

The present embodiment is so set that, when the mask 1 and the wafer 2 have no relative positional deviation (i.e. when the alignment marks 5 and 3 on the mask 1 and the wafer 2 just provide a coaxial system), the chief ray of the alignment light emitting from the wafer 2 has an angle of emission of 5 degrees, and the projection of the emitted light to the wafer 2 surface extends perpendicularly to the widthwise direction (y direction) of the scribe line and, additionally, the emitted light is focused on the sensor 11 surface which is disposed at a predetermined position, for example, at a height of 20 mm from the wafer 2 surface.

On the other hand, the reflectively diffracted light of the predetermined order or orders (e.g. first order diffraction light), reflectively diffracted by the reference mark 6, has its projection to the mask 1 surface extending orthogonally to the widthwise direction of the scribe line and emanates at an angle of 15 degrees with respect to a normal to the mask 1 surface. This diffraction light is imaged at a position (x1, y1, z1), wherein x1=0.0, y1=5.4 and z1=20.2, in the reference coordinate system having its origin on the mask. The sensors 11 and 12 are disposed parallel to each other.

In other words, the light from the reference mark 6 is focused on the surface of the sensor 12 (second detecting means). Here, the first order reflective diffraction light from the reference mark 6, as it is incident on the sensor 12 surface, has the position of its center of gravity maintained fixed regardless of any change in the positional deviation between the mask 1 and the wafer 2.

The grating lens of the reference mark 6 provided on the mask 1 surface, in this embodiment, has a relatively long focal length, from the reflective diffraction of the reference light by the reference mark on the mask 1 to the impingement to the sensor 12 surface.

Next, a description will be provided of an error which occurs, at the time of detection of the positional deviation, if the alignment head accommodating therein the light source, the sensor means and the like, is rotated or inclined to cause a change in the angle of incidence of the alignment light upon the alignment mark (first alignment mark 5), as well as the manner of correcting such an error, based on signal processing, after the reference light from the reference mark 6 is received by the sensor 12.

It is now assumed that the alignment head is inclined within a section that contains the positional deviation detecting direction (X direction) and a normal to the mask surface, by an amount $\Delta\Gamma_1$ with respect to the normal to the mask surface. Where the distance in that section between the wafer surface and the sensor within the alignment head, in a normal state, is denoted by l, the inclination $\Delta\theta_1$ of the alignment head causes inclination of the alignment light of the same amount $\Delta\theta_1$ with respect to the normal to the mask surface and, as a result, the position of the center of gravity of light on the sensor displaced by an amount $\Delta x_{g1}$ which can be given by:

$$\Delta x_{g1} = 2l \tan \Delta\theta_1$$

Now, it is assumed that the alignment head is rotated within a section parallel to the mask surface, by an amount $\Delta\phi$ around the Z axis. Where the angle of incidence (in the Y-Z plane) of the alignment light with respect to the mask surface is denoted by $\alpha$, then the alignment head is inclined within the section (X-Z plane) containing the positional deviation detecting direction, effectively by an amount $\Delta\theta_2$ with respect to the normal to the mask surface, which is given by:

$$\Delta\theta_2 = \tan^{-1}(\tan \alpha \cdot \tan \Delta\phi)$$

Therefore, the position of the center of gravity of light upon the sensor, within the alignment head, displaced, with the rotation $\Delta\phi$ of the alignment head, by an amount $\Delta x_{g2}$ which is given by:

$$\Delta x_{g2} = 2l \tan \Delta\theta_2$$

Further, if the alignment head is inclined within the X-Z plane to produce $\Delta\theta_1$ and, additionally, if the alignment light is inclined within the X-Z plane by an amount $\Delta\theta_2$ with the rotation $\Delta\phi$ around the Z axis, then, upon the sensor accommodated in the alignment head, there occurs displacement of the center by gravity of the alignment light of an amount which can be given by:

$$\Delta x_g = 2l \tan(\Delta\theta_1 + \Delta\theta_2)$$

As described, when the alignment head is inclined or rotated relative to the mask surface and the alignment light is in effect inclined by $\Delta\theta$ within a plane (x-z plane) containing the positional deviation detecting direction, there occurs, at the time of detection of the positional deviation, an offset error $\Delta x_g/m$ (m is a detection magnification).

In the present embodiment, in order to correct the error resulting from the inclination or rotation of the alignment head, a reference mark is provided on the mask and, by using the light receiving sensor (line sensor) provided in the alignment head for receiving the reference light, any error $\Delta x'_g$ in the position of the center of gravity of the reference light is detected. From the distance $l'$ between the mask surface and the reference light receiving sensor, the inclination $\Delta \theta$ of the alignment light within the X-Z plane, resulting in an error in the detection of the positional deviation, can be given and is expressed as follows:

$$\Delta\theta = \tan^{-1}(\Delta x'_g/2l')$$

Here, the reference light 8 is within the plane of incidence and, also, the alignment light 7 is present substantially within the plane of incidence. Further, these lights go along optical paths of substantially the same length. Therefore, if the alignment head is inclined, for example, on the sensor 12 surface which is parallel to the sensor 11 surface there occurs exactly the same displacement of the center of gravity as of that of the signal light (alignment light). The reference light does not cause displacement of the center of gravity thereof on the sensor with the positional deviation of the wafer to the mask in the X direction (or in the Y direction). In this case, therefore, it can be considered that any displacement of the center of gravity as detected upon the sensor 12 depends only on the inclination or rotation of the alignment head relative to the mask. Thus, by detecting the interval in the X direction between the positions of the gravity centers of these lights upon the sensors 11 and 12, it is possible to detect the relative positional deviation between the mask and the wafer in the X-direction, without being affected by relative inclination or rotation of the alignment head to the mask.

The mask and the wafer can be aligned in several ways. A first method is that, by using the CPU 102, the amount of positional deviation is detected from a differential signal S' (=S−Sg) between a reference signal Rg and a positional deviation detecting signal Sg, representing the position of incidence of the light in the X coordinate, and by using the detected value the X-Y stage 100 is moved to achieve the alignment. Here, the value Sg can be detected by using l, g and the magnification m. A second method is that the alignment marks are so designed and set that the difference between the reference signal Rg and the positional deviation detection signal Sg, representing the X coordinate of the position of incidence of the light, becomes equal to zero when no positional deviation is present, such that the X-Y stage 100 is moved until a relation "Sg−Rg=0" is established, to thereby achieve the alignment.

Figure 3B:
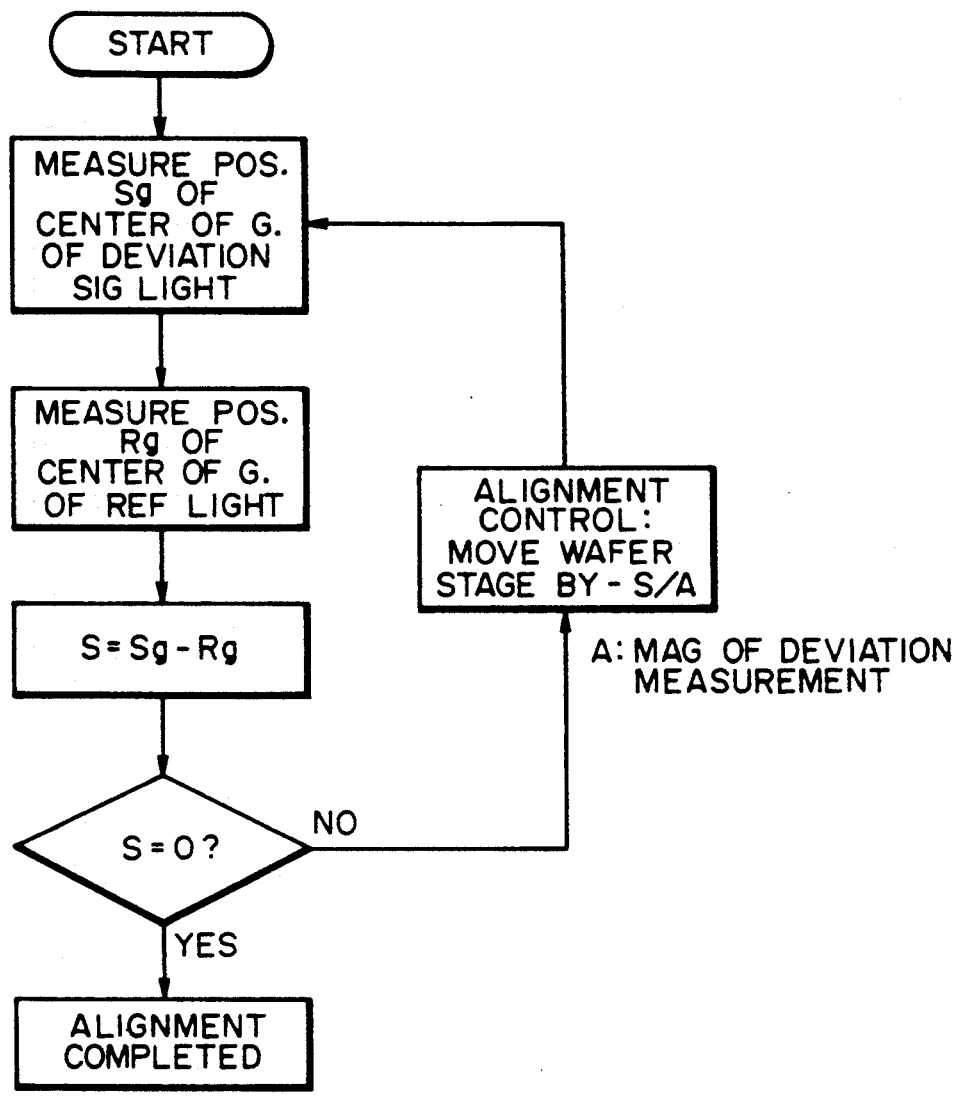
FIG. 3B is a flow chart showing details of the manner of aligning a mask and a wafer in accordance with the first embodiment.

In this embodiment, the second correcting method is adopted. The flow of the alignment method in this case is illustrated in FIG. 3B.

Here, character A denotes the magnification of the displacement of the center of gravity of light to the actual positional deviation. Alternatively, in the second correcting method, the arrangement may be made so that the difference between the signals Sg and Rg becomes equal to a predetermined value, other than zero, and the alignment control may be made accordingly.

As an example, first and second alignment marks 5 and 3 and a reference mark 6 (grating lens) usable in this embodiment can be prepared in the following manner:

First, the marks 5 and 6 for a mask are designed so that, when a parallel light of a predetermined beam diameter is incident thereupon at a predetermined angle, the light is collected at a predetermined position. Usually, a pattern of a grating lens may be that of an interference fringe which can be formed on a lens surface in the case where mutually coherent light sources are disposed at a light source position (object point) and the position of an image point. Assuming this, a coordinate system is defined on a mask 1 surface, such as shown in FIG. 3A. The origin is at the middle of the width of the scribe line, the x axis is in the direction of the scribe line, the y axis is in the widthwise direction and the z axis is in the direction of the normal of the mask 1 surface. Equations regarding a group of curved lines of such a grating lens by which a parallel light, having been incident thereon with an angle $\alpha$ with respect to the normal of the mask surface 1 and with the projection being perpendicular to the scribe line direction, is imaged after being transmissively or reflectively diffracted by the mark of the mask, at the position of a converging point $(x_1, y_1, z_1)$, can be expressed in the following manner, with the position of each grating line being denoted by x and y:

$$y \sin\alpha + P1(x,y) - P2 = m\lambda/2 \qquad (1)$$

$$P1(x,y) = \sqrt{(x - x_1)^2 + (y - y_1)^2 + z_1^2}$$

$$P2 = \sqrt{x_1^2 + y_1^2 + z_1^2}$$

wherein $\lambda$ is the wavelength of the alignment light and m is an integral number.

Assuming now that a chief ray is such a ray being incident with an angle $\alpha$ and passing through the origin on the mask surface 1 and then impinging upon a convergent point $(x_1, y_1, z_1)$, then the right side of equation (1) shows that, depending on the value of m, the optical path length is "$\lambda \times m/2$" times longer (shorter) than that for the chief ray; and the left side denotes the difference in length, with respect to the optical path of the chief ray, of the optical path of such a ray that passes a point (x, y, 0) on the mask and then impinges on the point $(x_1, y_1, z_1)$.

Figure 4A:
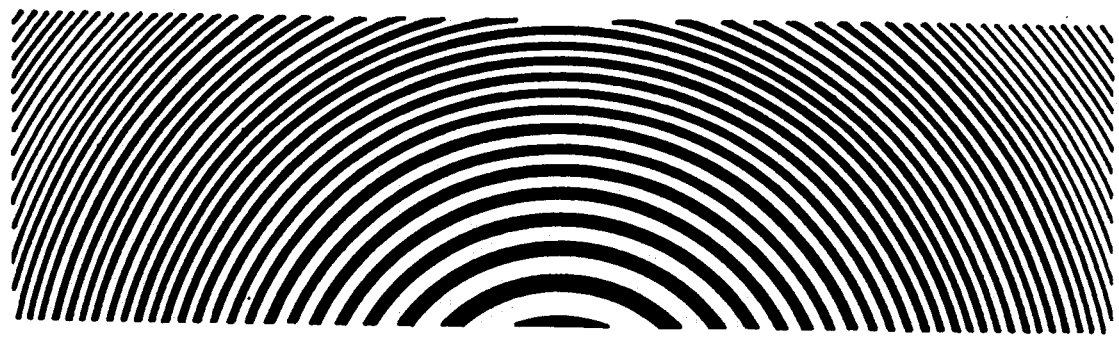
FIGS. 4A and 4B and FIG. 5 are schematic representations, showing examples of patterns of alignment marks which are usable in the first embodiment.
Figure 4B:
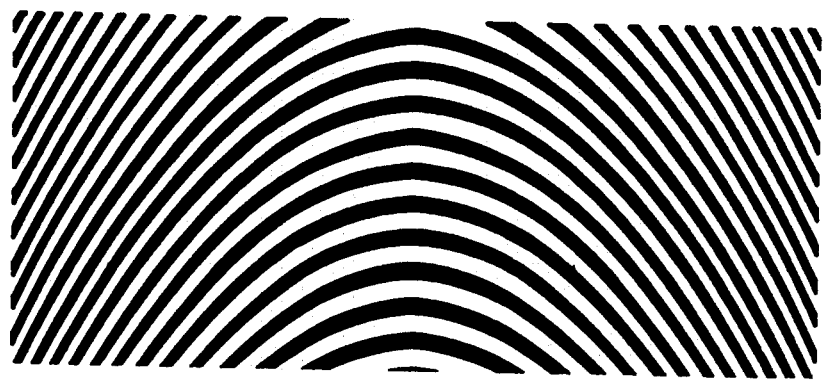

FIG. 4A exemplifies a first alignment mark on a mask 1, and FIG. 4B exemplifies a first reference mark on the same mask 1.

On the other hand, a grating lens to be provided on a wafer 2 is designed so as to collect, at a predetermined position (on the sensor surface), a spherical wave emanating from a predetermined point light source. Where the gap between a mask 1 and a wafer 2 at the time of exposure (pattern transfer) is denoted by g, then each point on such a point light source can be expressed by:

$$(x_1, y_1, z_1 - g)$$

Assuming now that the mask 1 and the wafer 2 are to be aligned with respect to the x-axis direction and that, upon completion of alignment, the alignment light is focused at a point $(x_2, y_2, z_2)$ on the sensor surface, then equations regarding a group of curved lines of a grating lens of a wafer can be expressed, in the coordinate system defined hereinbefore, as follows:

$$\sqrt{(x - x_2)^2 + (y - y_2)^2 + z_2^2} - \sqrt{(x - x_1)^2 + (y - y_1)^2 + (z_1 - g)^2} = \sqrt{x_2^2 + y_2^2 + z_2^2} - \sqrt{x_1^2 + y_1^2 + z_1^2} + m\lambda/2 \quad (2)$$

Equation (2) is such an equation that satisfies a condition under which, assuming that the wafer surface is "$z = -g$" and that the chief ray is such a ray that passes the origin on the mask surface and a point $(0, 0, -g)$ on the wafer surface and additionally a point $(x_2, y_2, z_2)$ on the sensor surface, the difference in length between the path of the chief ray and the path of a ray passing the grating $(x, y, -g)$ on the wafer surface becomes equal to a multiple, by an integral number, of a half wavelength.

Figure 5:
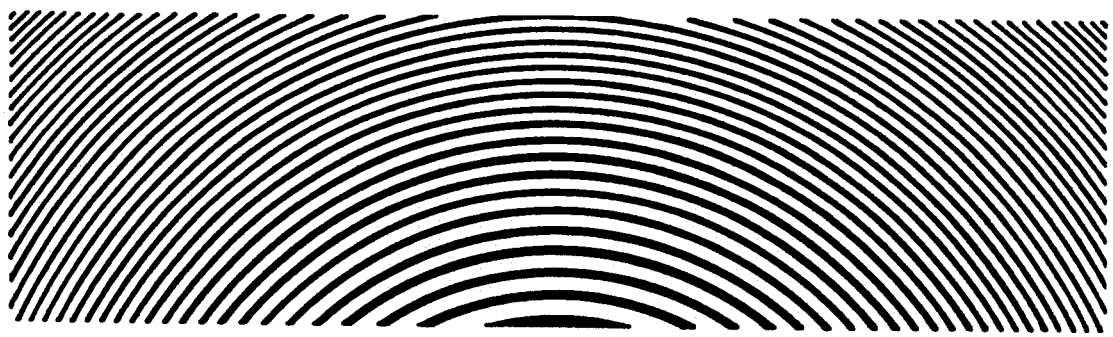

FIG. 5 illustrates a second alignment mark on a wafer 2.

Generally, a zone plate (grating lens) for a mask can be formed as an amplitude type grating element of "0 and 1" in which two regions, a region (transparent portion) that can transmit light and a region (light blocking portion) which does not transmit light, are formed alternately. On the other hand, a zone plate for a wafer can be formed as a phase grating pattern having a rectangular section, for example. The fact that, in equations (1) and (2), each line of a grating is defined at a position which corresponds to a multiple, by an integral number, of a half wavelength with regard to the chief ray, means that the linewidth ratio of the transparent portion and the light blocking portion is 1:1 in the case of the grating lens on a mask 1, and that the line and space ratio of rectangular grating is 1:1 in the case of the grating lens on the wafer 2.

As a specific example, a grating lens on a mask 1 was formed by transferring, onto an organic thin film of polyimide, a grating lens pattern of a reticle prepared by use an electron beam exposure technique.

On the other hand, a mark on a wafer 1 was formed by preparing on a mask a pattern to be printed on a wafer and then by transferring the pattern by use of a lithographic process.

A description will now be provided of the relationship between an alignment light and a reference light to be incident on a sensor (detecting means) which may comprise an accumulation type one-dimensional CCD sensor, for example.

In this embodiment, the reference light and the alignment light emanate from the wafer surface at angles 15 degrees and 5 degrees, respectively, with respect to the normal of the wafer surface and with the projection, upon the wafer surface, being orthogonal to the scribe line direction. The spatial disposition of the sensors 11 and 12 is so set that, upon completion of alignment, a light is incident on a corresponding sensor substantially at the middle position.

The sensors 11 and 12 have a spacing of 2 mm between their centers, and are mounted to a common base plate, made of Si, at a precision of about 0.1 micron. The Si base plate on which the sensors 11 and 12 are mounted, is disposed so that its normal extends substantially parallel to a bisector for the angle of emission of the alignment light and the angle of emission of the reference light, when the mask and the wafer have no relative positional deviation.

As regards the size of the sensors 11 and 12, the sensor 11 for the signal light is 1 mm in width and 6 mm in length, whereas the sensor 12 for the reference light is 1 mm in width and 1 mm in length. Each picture element (pixel) has a size of $25 \times 500$ microns. The picture elements are arrayed one-dimensionally in the x-axis direction with respect to which any relative positional deviation of the mask and wafer should be detected.

Each sensor is operable to measure the position of the center of gravity of incident light, and output signals from the sensor are processed so as to be standardized with regard to the total light quantity over the whole light-receiving region. By this, even if the output power of a light source for alignment changes slightly, the measured value as outputted from the sensor system exactly represents the position of the center of gravity. Although the resolution of the sensor, for the position of the center of gravity, may depend on the power of the alignment light, it was 0.2 micron where a semiconductor laser having a power of 50 mW and a wavelength 0.83 micron was used, by way of example.

In a design example for a grating lens of a mask and a grating lens of a wafer, to be used in the present embodiment, the center of gravity of the signal light displaced along the sensor surface, with the positional deviation between the mask and the wafer being magnified by $\times 100$. Therefore, a positional deviation of 0.01 micron between the mask and the wafer results in an effective displacement of the center of gravity on the sensor surface through 1 micron. The sensor system can measure such a displacement with a resolution of 0.2 micron.

If, in this embodiment, the alignment head is inclined within an x-z plane by an amount 1 mrad, there occurs on the sensor 11 a displacement of about 20 microns of the center of gravity of the signal light. On the other hand, on the sensor 12, there occurs displacement of the center of gravity of the reference light 8 exactly the same as the signal light. Thus, by processing signals from the sensors so as to detect and output a difference between those signals representing the positions of the effective centers of the gravities, the output signal from the sensor system does not change even if the wafer surface is inclined within the x-z plane.

If, on the other hand, the alignment head is inclined within a y-z plane, both the signal light and the reference light causes displacement of the center of gravity in a direction (widthwise direction) perpendicular to the lengthwise direction of the sensor. However, such a displacement is in a direction which is perpendicular to the direction of displacement of the center of gravity of light resulting from the positional deviation (which is just to be detected). Therefore, without the reference light, no practical alignment error occurs.

Further, where the alignment head which may contain an alignment light source, a light projecting lens system and sensors, is shifted relative to a mask and wafer system (for example, if the head is displaced by 5 microns in the y direction relative to a mask), there occurs an effective displacement of the center of gravity of the signal light, on the sensor 11 surface, by an amount of 5 microns. In this connection, also the center of gravity of the reference light displaces on the sensor 12 by an amount of 5 microns, exactly the same as the signal light. Similarly, a deviation of 10 microns between the mask surface and the head, in the z direction, results in a displacement, through 10 microns, of the center of gravity of light upon each of the signal-light sensing sensors 11 and the reference-light sensing sensor 12.

Therefore, no change occurs in the final output of the sensor system, namely, in the differential signal representing the difference between an output relating to the position of the center of gravity of the signal light and an output relating to the center of gravity of the reference light.

It will be readily understood that any change in the position with respect to the y-axis direction does not result in an essential alignment error, even when a reference light is not used.

Figure 6:
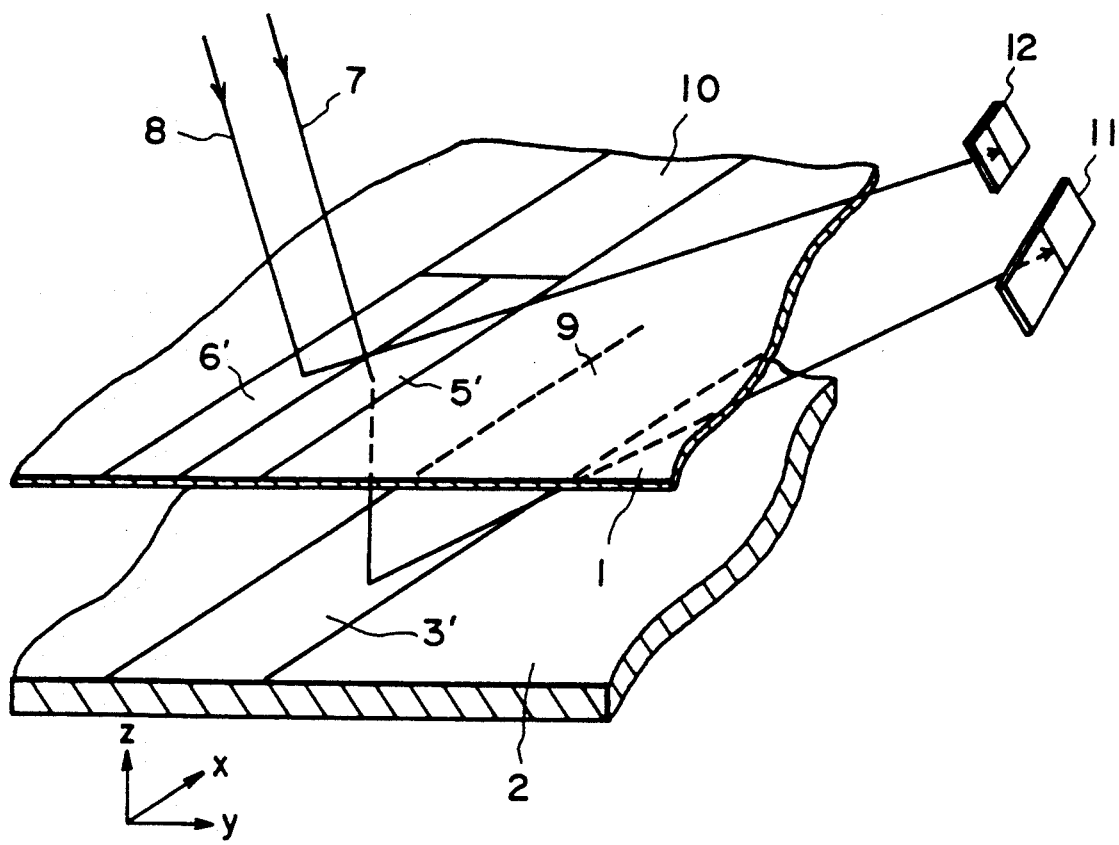
FIG. 6 is a perspective view schematically showing a major part of a second embodiment of the present invention.

FIG. 6 is a schematic view of a second embodiment of the present invention. In this embodiment, like the first embodiment shown in FIG. 3A, as a reference light setting means, a reference mark 6' formed by a predetermined grating lens is used.

As in the first embodiment, a mask is provided with a grating lens 5' which is so set that light incident thereupon at a predetermined angle with respect to the normal to the mask surface is collected at a position which is at a distance 238.0 mm vertically below the mask surface. The interval between the mask 1 and a wafer 2 is set to be 30 microns, as in the first embodiment.

In this embodiment, the first alignment mark 5' and the reference mark 6' are juxtaposed to each other in the widthwise direction (Y direction) of a scribe line 10.

The reference mark 6' has such a focal length that the inputted light from an alignment head, after being reflectively diffracted by the mark with positive or negative first order, is converged at a point which is just on a sensor 12 provided within the alignment head for receiving the reference light.

The present embodiment is so set that, when the mask 1 and the wafer 2 have no relative positional deviation (i.e. when the alignment marks 5' and 3' on the mask 1 and the wafer 2 just provide a coaxial system), the chief ray of the alignment light emitting from the wafer 2 has an angle of emission of 5 degrees, and the projection of the emitted light on the wafer 2 surface extends perpendicularly to the direction (x direction) of the scribe line and, additionally, the emitted light is focused on the sensor 11 surface which is disposed at a predetermined position, for example, at a height of 20 mm from the wafer 2 surface.

As regards the first order reflective diffraction light, reflected by the reference mark 6', even if there occurs a change of the positional deviation between the mask 1 and the wafer 2, there does not occur displacement of the position of the center of gravity on the sensor with the misalignment between the grating lenses of the mask and the wafer being magnified, as in the case of the alignment light, and the position of the center of gravity thereof is constantly held fixed.

In this embodiment, the sensors 11 and 12 for the alignment light and the reference light are so set that, when there is no positional deviation between the mask and the wafer, the lights are incident on the respective sensor surfaces perpendicularly. Also, the sensors 11 and 12 are formed on a common base plate which is set so that the base plate extends orthogonally to the bisector of the emission angles of the two lights from the wafer (namely, it defines an angle of 6.5 degrees with respect to a normal to the mask or wafer surface). As a result, the signal light emanating from the wafer surface is substantially kept within the plane of incidence and, also, the reference light is kept within the plane of incidence. Further, the optical paths are of the same length. Therefore, any inclination or rotation of the alignment head produces exactly the same displacement of the alignment light and the reference light upon the respective sensors 11 and 12 which are disposed parallel to each other. Similarly, any change in the position of the alignment head does not cause a relative shift of the center of gravity, between the alignment light and the reference light.

The first alignment mark 5' and the reference mark 6' each have a size of 280 microns in the direction of the scribe line and 40 microns in the widthwise direction of the scribe line. Also, the alignment is made in respect to the direction of the scribe line.

In the second embodiment, the marks on the mask 1 are arrayed in the widthwise direction of the scribe line. As a result, this embodiment has the following advantageous features as compared with the first embodiment.

In the first embodiment, a mark for the signal light and a mark for the reference light are arrayed in the direction of the scribe line. The region in which alignment marks are to be set is limited to a certain area (for example, 280×80 microns) on the scribe line. As a result, it is not so easy to obtain a lens having a focal length in a certain range and having superior imaging performance. For example, comparing a case where a region of 280×80 microns is uniformly divided in the scribe line direction and a lens is prepared by using a region of 140×80 microns, with a case where the region is divided in the widthwise direction and a lens is prepared by using a region of 280×40 microns, there is a difference, about twice, in the number of lines of the grating in the scribe line direction. Usually, the imaging performance (resolution) of a zone plate is better with a larger number of gratings and a smaller size of a minimum ring width.

Where marks are arrayed in the widthwise direction of the scribe line and the alignment is made by using a lens power in the scribe line direction perpendicular thereto, distortion of light on the sensor is reduced and, therefore, the resolution and the precision can be improved easily.

Figure 7:
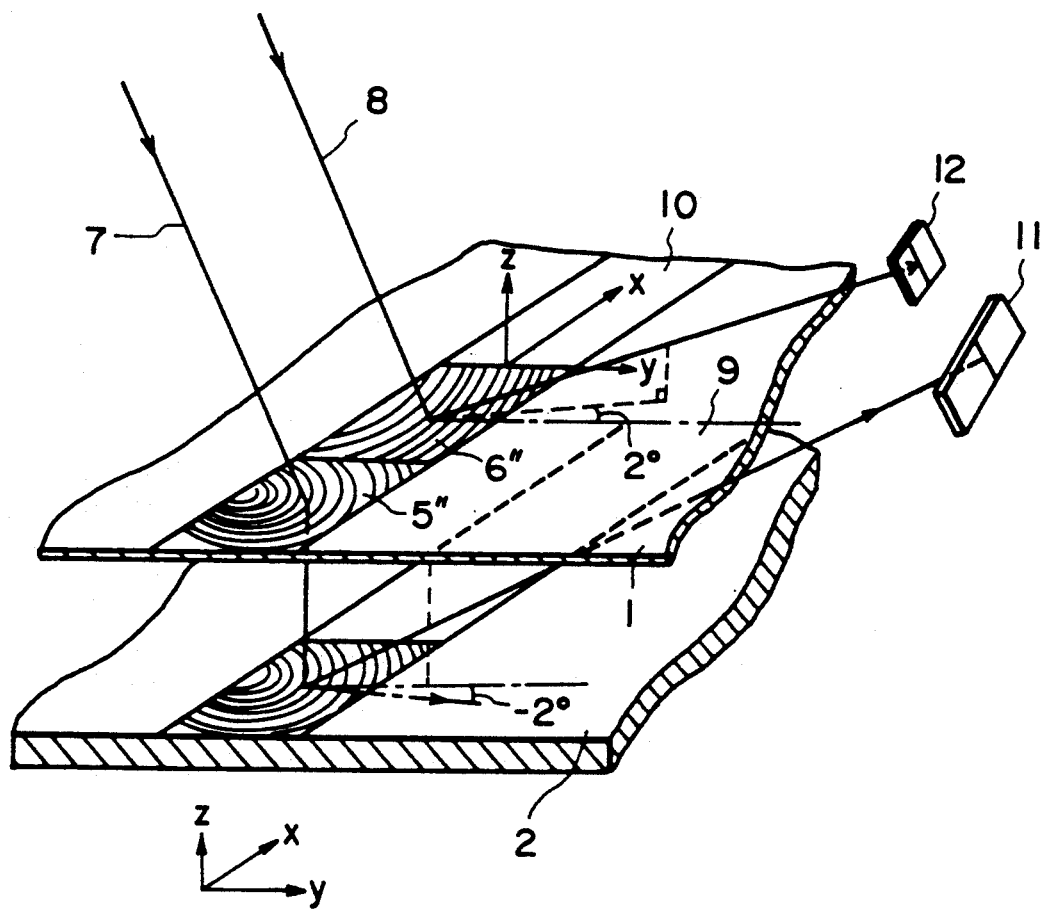
FIG. 7 is a perspective view schematically showing a major part of a third embodiment of the present invention.

FIG. 7 is a schematic view of a third embodiment of the present invention. In this Figure, the reference numerals as of the first embodiment shown in FIG. 3A are assigned to corresponding elements.

A description will now be provided of first and second alignment marks 5" and 3" and a reference mark 6" used in this embodiment.

The alignment marks 3" and 5" and the reference mark 6" are provided by Fresnel zone plates (or grating lenses) each having a predetermined focal length. Each mark has a size of 140 microns in the lengthwise direction of the scribe line and 50 microns in the widthwise direction (y direction) of the scribe line.

In this embodiment, both the alignment light 7 and the reference light 8 are incident on the mask 1 at an angle of incidence of 10 degrees, with the projection upon the mask 1 surface being perpendicular to the scribe line direction (x direction).

The alignment light 7 and the reference light 8 incident on the mask 1 with a predetermined angle are influenced by the lens functions of the grating lenses 5" and 6", respectively, each being transformed into a convergent or divergent light which is emitted from the mask 1 so that its chief ray has a predetermined angle with respect to the normal of the mask 1.

The alignment light 7 having been transmissively diffracted by the first alignment mark 5" is collected at a point on the wafer 2 surface which is at a distance of 238.0 microns vertically below the mark. The alignment mark 5", in this case, has a focal length of 238 microns. Also, the mask 1 and the wafer 2 are spaced by a distance of 30 microns.

The light transmissively diffracted by the alignment mark 5" is influenced by a concave or convex lens function of the second alignment mark 3" on the wafer 2 surface, and is focused at a point on the sensor 11 surface (first detecting means). On this sensor 11 surface, at this time, the light is incident with any relative positional deviation (i.e. any misalignment of the axes) of the alignment marks 5" and 3" being magnified, with the result of a corresponding shift of the position of the center of gravity of the incident light.

The present embodiment is so set that, when the mask 1 and the wafer 2 have no relative positional deviation, the chief ray of the alignment light emitting from the wafer 2 has an angle of emission of 5 degrees, and the projection of the emitted light on the wafer 2 surface extends with an angle 2 degrees to the widthwise direction (y direction) of the scribe line and, additionally, the emitted light is focused on the sensor 11 surface which is disposed at a predetermined position, for example, at a height of 20 mm from the wafer 2 surface.

As regards the first order reflective diffraction light, reflected by the reference mark 6", even if there occurs a change of the positional deviation between the mask 1 and the wafer 2, there is not produced displacement of the center of gravity upon the sensor, as that of the alignment light, with the misalignment between the grating lenses of the mask and the wafer being magnified, but the position of the center of gravity thereof is constantly kept fixed. The arrangement of the present embodiment is set so that the angle of emission of the chief ray of the reference light 8 from the mask 1 surface is equal to 5 degrees, while the projection thereof has an angle of −2 degrees with respect to the widthwise direction of the scribe line 10. Setting the emission angles of the signal light and the reference light to be equal to 2 degrees and −2 degrees, respectively, with respect to the scribe line direction, can assure good separation of the signal light and the reference light on the sensor and thus makes it possible to reduce crosstalk.

It will be understood from the foregoing that, in this embodiment, the grating lens of the reference mark 6" provided on the mask 1 surface has a relatively long focal length, from the reflection of the reference light by the mask 1 surface to the impingement on the sensor 12 surface of the reference light.

Also, the one-dimensional sensors 11 and 12 for detecting the positional deviation are formed on a common base plate, as in the first embodiment, which base plate is so set that a normal to the surface of the base plate is coincident with a bisector of the emission angles of the signal light and the reference light from the wafer.

Also, the mark for the reference light and the mark for the signal light are set in accordance with equations (1) and (2) having been described with reference to the first embodiment.

Also, in this embodiment, the reference light 8 and the alignment light 7 travel along respective optical paths of substantially the same length, and the sensor 11 surface and the sensor 12 surface are made parallel to each other. Further, the distance from each alignment mark to the corresponding sensor is sufficiently long, whereas the angle defined by the projection on the X-Y plane of each light with respect to the Y axis or relative to the scribe line is sufficiently small (in this particular example, 2 degrees and −2 degrees). As a result, any change in the angle of emission of each light 7 or 8 due to the inclination or the like of the alignment head produces exactly the same displacement of the center of gravity, on each of the sensors 11 and 12.

As a consequence, any inclination or rotation of the alignment head or any change in the position of the alignment head, relative to the mask-wafer system, can be cancelled, in the manner described hereinbefore, on the basis of a detection signal of the center of gravity as supplied from the sensor receiving the reference light and the detection signal of the gravity center as supplied from the sensor receiving the signal light. Therefore, substantially the same positional deviation detecting performance as of the first embodiment is obtainable.

Figure 8:
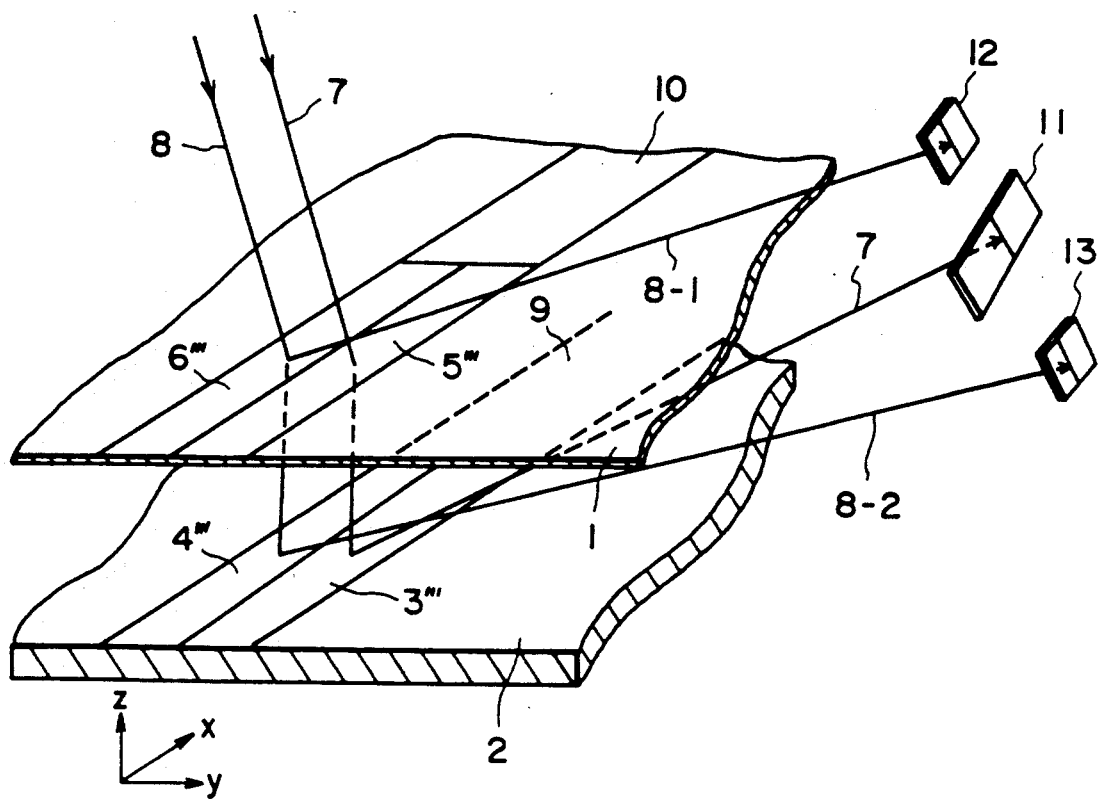
FIG. 8 is a perspective view schematically showing a major part of a fourth embodiment of the present invention.

FIG. 8 is a schematic view of a fourth embodiment of the present invention.

This embodiment corresponds to a combination of the structure of the foregoing embodiment and such structure wherein each of a mask and a wafer is provided with a reference mark for detecting the inclination of the wafer, for example, and wherein a reference light receiving sensor is provided in an alignment head.

In this embodiment, the wafer is provided with a mark 4'" for reference light and, additionally, a reference light receiving sensor 13 for detecting the inclination of the wafer is provided within the alignment head. Also, an alignment light receiving sensor 11 as well as a reference light receiving sensor 12, for detecting the attitude of the alignment head, are provided in the alignment head, like the first to third embodiments. The arrangement of the marks as well as the disposition of the sensors within the head are substantially the same as those in the second embodiment, and the separation of the alignment light and two reference lights 8-1 and 8-2 is made on the basis of the difference in the angle of emission with respect to a normal to the wafer surface. The positional deviation detecting direction lies in the direction of the scribe line on the mask (i.e. X direction). The central axis of each physical optic lens element as well as the center of gravity of light received by each sensor within the alignment head are within the same plane of the inputted light (i.e. the plane of incidence).

In the fourth embodiment, the mask is provided with a mark 6'" for the reference light, which is designed so that the first order reflective diffraction light therefrom is collected and imaged on the sensor 12 within the alignment head, and the reference emission angle with respect to a normal to the mask surface is 5 degrees. On the other hand, transmitted first order diffraction light from the mark 6'" of the mask for the reference light provides a reference light for detecting the inclination of the wafer, for example, and it is influenced by the first order reflection by the mark 4'" of the wafer and is focused on the sensor 13 within the alignment head. The mark 4'" of the wafer, for the reference light, is provided by a rectilinear grating having no lens function, and the angle of emission of the light from the wafer surface is 13 degrees, regardless of the positional deviation between the mask and the wafer.

Alignment light for detecting the amount of positional deviation, is transmissively diffracted at first order, for example, by a grating lens 5''' on the mask and, then, is reflectively diffracted at the first order by a grating lens 3'''. Finally, it is transmitted at the zero-th order through the mask. The angle of emission of the alignment light with respect to a normal to the wafer surface is 9 degrees, and it is received by the sensor 11 in the alignment head.

In this embodiment, the relationship between the signal light 7 and the reference light 8-1 is the same as that between the alignment light 7 and the reference light 8 in the second embodiment, and by using the outputs of the sensors 11 and 12 in the manner described hereinbefore, it is possible to compensate for the inclination or otherwise of the alignment head.

Both of the reference lights 8-1 and 8-2 are in the plane of incidence and, additionally, they travel along respective optical paths of substantially the same length. Therefore, any inclination of the alignment head produces exactly the same displacement of the center of gravity upon each of the sensor 12 surface and the sensor 13 surface which are parallel to each other. If the wafer 2 surface includes waviness, inclination or the like, the center of gravity of the reference light 8-2 displaced. However, the center of gravity of the reference light 8-2 does not shift. Therefore, the difference between the signals $Rg_1$ and $Rg_2$, representing the positions of incidence of the lights upon the sensors 12 and 13, respectively, is indicative of the inclination of the wafer. By obtaining, in a preparation phase, the relationship between the inclination of the wafer and the difference ($=Rg_1-Rg_2$) on the basis of experiments, for example, the inclination component of the wafer can be determined on the basis of the detection of the difference ($=Rg_1-Rg_2$). By using the detected value, the inclination of the wafer can be corrected by moving the wafer stage, for example. Alternatively, the positional error as determined on the basis of the output of the sensor 11 may be compensated for. In this manner, it is possible to avoid the effect of the inclination of the wafer 2.

In the fourth embodiment, it is possible to correct the amount of displacement (resulting in an error factor for the detection of the positional deviation) of the light upon the sensor from its regular position, which is caused when the wafer surface is inclined in the X-Z plane, even locally. Thus, by combining this with the correction of the positional deviation detection error due to a change in attitude of the alignment head as described with reference to the foregoing embodiment, it is possible to make an overall correction of the mechanical setting error and, therefore, it is possible to ensure high-precision detection of the positional deviation.

In this embodiment, the power arrangement (focal length) of the grating lens for the signal light as well as the positional deviation detecting magnification are set in the same way as in the first to third embodiments. However, the present invention is not limited thereto.

In FIG. 8, the alignment light 8 is incident on the mask surface with an inclination, and the light emanating from the wafer surface travels at an inclination, with the sign of the Y-axis component perpendicular to the scribe line being unchanged (+Y axis direction). However, the invention is not limited to such a structure. For example, the inclined emission light from the wafer surface may lie in the −Y axis direction.

In the embodiments described hereinbefore, the alignment marks are so arranged that the correct alignment is discriminated when the wafer alignment mark is positioned just underneath the mask alignment mark. However, they may be disposed with a mutual shift in a direction perpendicular to the positional deviation detecting direction. For example, in the case of the third embodiment shown in FIG. 7, wherein the positional deviation between the mask and the wafer is to be detected with respect to the direction of the scribe line of the mask, the width of the alignment mark of the wafer may be shifted in the Y direction, wherein the scribe line direction lies in the X direction. By setting the position of the wafer alignment mark in this manner, it is possible to reduce the angle of incidence on the mask surface of the light from the alignment head. As a result, it is possible to make the grating interval not less than the wavelength ($\lambda=0.83$ micron, for example) of the alignment light, thus making it easier to prepare the alignment mark.

Further, the sensor is not limited to one that is adapted to detect the positional deviation one-dimensionally, as in the first to fourth embodiments. Two-dimensional gravity center detecting sensor such as a two-dimensional CCD, for example, may be used.

When such a two-dimensional sensor is used to detect the positional deviation, the position of the center of gravity of the light intensity distribution of the alignment light upon the sensor, with respect to the positional deviation detecting direction, may be measured. Where a grating lens has a lens function both in the positional deviation detecting direction and in a direction perpendicular thereto, as compared with a case where the grating lens has a lens function only in the positional error detecting direction, use of a two-dimensional sensor makes it possible to obtain positional information in regard to a desired direction. However, when the positional deviation in a particular direction is to be detected by using a two-dimensional sensor comprising a CCD, it is necessary that, after the two-dimensional light intensity distribution on the sensor is recorded by using an image memory or the like, the position of the center of gravity of the light intensity in that direction is detected on the basis of numerical computation.

In the embodiments described hereinbefore, the surface of the second object may be used as a reference surface. In that occasion, a reference mark may be provided on the second object, and the zero-th order transmission light from the first object may be inputted to the reference mark on the second object. By receiving reflective diffraction light of a predetermined order or orders from the reference mark, substantially the same advantageous effects are attainable.

Figure 9:
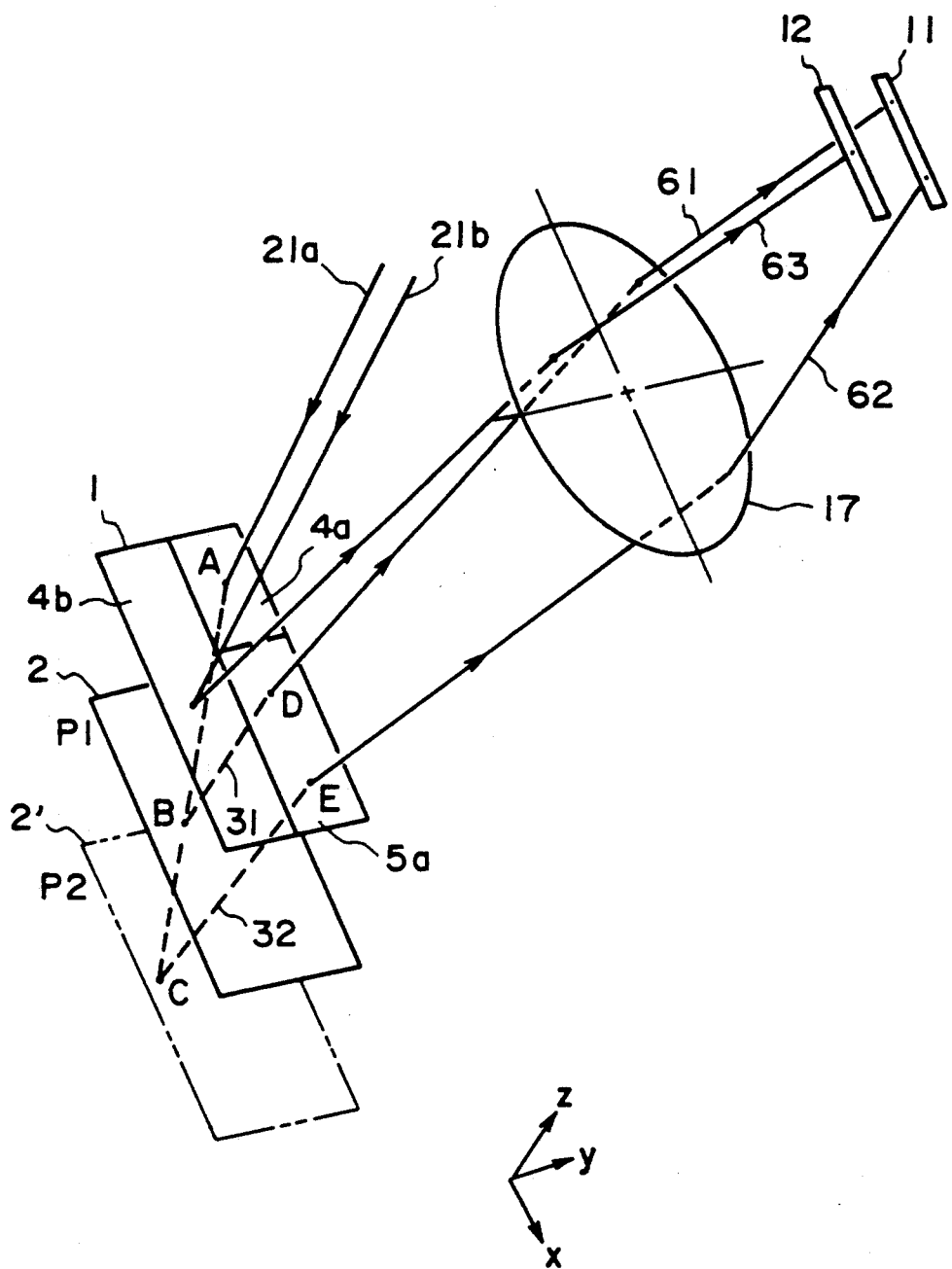
FIG. 9 is a perspective view schematically showing a major part of a fifth embodiment of the present invention.
Figure 10:
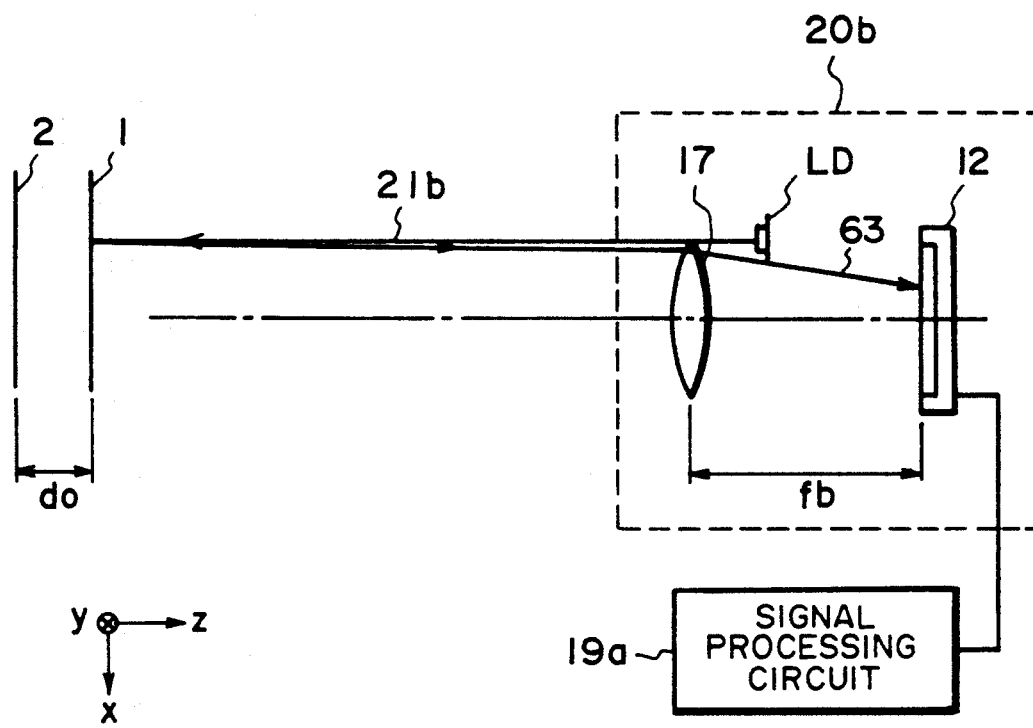
FIG. 10 is a schematic representation, illustrating a correcting system included in the fifth embodiment.

FIGS. 9 and 10 are schematic views, respectively, showing optical arrangements of a measuring system and a correcting system in accordance with a fifth embodiment, in which the invention is applied to a device for measuring the interval between a mask and a wafer, in a semiconductor device manufacturing exposure apparatus.

In this embodiment, the measuring system is such a system for measuring, chiefly, the interval between first and second objects, while the correcting system is such a system for correcting a measurement error due to any change in attitude of an illumination system or a light receiving system relatively to the surface of the object.

In FIGS. 9 and 10, reference numerals 21a and 21b denote lights each from a light source LD such as, for example, a He-Ne laser, a semiconductor laser or otherwise. Of these lights, the light 21a is for the measuring system, while the light 21b is for the correcting system.

First object 1 is a mask, for example, and a second object 2 is a wafer, for example. The mask 1 and the wafer 2 are disposed opposed to each other, as illustrated in FIG. 9, with a spacing $d_0$. Denoted at 4a and 5a are physical optic elements provided in a portion of the mask 1 surface, for light reception and emission in the measuring system. These physical optic elements 4a and 5a each is formed by a diffraction grating or a zone plate, for example. These elements have sizes of about 30×30 microns and 30×60 microns, respectively.

Similarly, denoted at 4b is an physical optic element provided in the correcting system. It has a size of 30×30 microns, for example.

The physical optic element 5a for the light emission in the measuring system has such characteristics that the deflection angle for the emitting light changes depending on the position of incidence of light thereupon and, in this example, it has a refraction power for focusing a received parallel light at a distance of 1000 microns.

Denoted at 17 is a condensing lense for the measuring system and the correcting system, which has a focal length $f_a$. For example, $f_a$ is approximately equal to 30 mm.

Denoted at 11 and 12 are light receiving means (sensors) of the measuring system and the correcting system, respectively, both of which are disposed at the focal point position of the condensing lense 17. Each light receiving means may comprise a line sensor, PSD or otherwise and is adapted to detect the position of center of gravity of light incident thereupon. Signal processing circuit 19a operates to determine the positions of lights incident upon the surfaces of the light receiving means 11 and 12, by using signals from these light receiving means, and also to detect, by calculation, the spacing $d_0$ between the mask 1 and the wafer 2 and/or the amount of correction to be made in relation to the inclination of an optical pickup head, which will be described later in detail.

Denoted generally at 20b is an optical pickup head which accommodates the condensing lens 17, light receiving means 11 and 12 and, if desired, the signal processing circuit 19a. The optical head is movable relative to the mask 1 and wafer 2.

The function of the measuring system shown in FIG. 9 will be explained.

It is assumed in this Figure that the mask 1 and the wafer 2 are correctly disposed in a parallel relationship.

In this embodiment, the light 21a (whose wavelength $\lambda = 830$ nm) from a semiconductor laser LD is perpendicularly incident on a point A on the surface of a grating 4a of the mask 2. Then, diffraction light of a predetermined order or orders, diffracted at an angle $\theta 1$ from the first physical optic element 4a is reflected at a point B (C) on the wafer 2 surface. Of the reflection lights caused thereby, the reflection light 31 is one as obtainable when the wafer 2 is located at the position P1 close to the mask 1. The reflection light 32 is one which is obtainable when the wafer 2 is displaced by a distance $d_G$ from the position P1, namely, to the position P2.

Subsequently, the light reflected from the wafer 2 is incident on a point D (E) on the surface of an off-axis type Fresnel zone plate (hereinafter simply "FZP") 5a which is provided on the first object 1.

The FZP 5a has an optical function for changing the emission angle for the emitted diffraction light in accordance with the position of incidence of the light thereupon.

Diffraction light 61 (62) of a predetermined order or orders, diffracted at an angle $\theta 2$ from the FZP 5a is directed through the condensing lens 17 to the surface of the light receiving means 11.

The spacing between the mask 1 and the wafer 2 can be detected by calculation, on the basis of detection of the position of light 61 (62) incident upon the light receiving means 11 surface.

In this embodiment, the first and second physical optic elements 4a and 5a provided on the mask 202 each is formed with a preset pitch, and the diffraction angles $\theta 1$ and $\theta 2$ of the diffraction lights of the predetermined order or orders (for example, ± first order) incident on these plates are detected preparatorily.

The manner of detecting the spacing between the mask 1 and the wafer 2 will now be explained, taken in conjunction with FIG. 9.

As shown in FIG. 9, where the distance to the mask 1 from the intersection F between the diffraction lights 61 and 62 (i.e., the focal length of the physical optic element for the light emission) is denoted by $f_M$, then $$AD = 2d_0 \tan\theta 1$$
$$AE = 2(d_0 + d_G) \tan\theta 1$$
$$\therefore d_M = DE = AE - AD = 2d_G \tan\theta 1 \quad (6)$$
Also,
$$d_M = 2 \cdot f_M \cdot \tan\theta 2 \quad (7)$$

The amount S of motion of the incident light upon the light receiving means 11 surface is given by:

$$S = 2 \cdot f_a \cdot \tan\theta 2 \quad (8)$$

Thus, it follows from equations (6), (7) and (8) that $$S = 2 \cdot d_G \cdot f_a / f_M \cdot \tan\theta 1 \quad (9)$$

The deviation $\Delta S$ of the incident light upon the light receiving means 11 surface, corresponding to a unit change in the gap between the mask 1 and the wafer 2, namely, the sensitivity $\Delta S$ is given by:

$$\Delta S = S/d_G = 2 \cdot f_a / f_M \cdot \tan\theta 1 = f_a / f_M \cdot d_M / d_G \quad (10)$$

In this embodiment, reference light 63 emanates from the mask at a constant angle of emission regardless of any change in the interval between the mask and the wafer. The position of the center of gravity of this light upon the sensor is used as a reference. That is, the interval in the X direction between the reference position and the position of the center of gravity of light 61 (62) on the sensor is measured. Then, the measured value is compared with a reference interval which is the interval in the X direction between the positions of the gravity centers of these lights when the wafer is at the position (e.g. P1) of the correct mask-to-wafer interval $d_R$. Any error S detected by this comparison is substituted into equation (9), and the error $d_G$ in the interval from the correct interval position P1 of the wafer is detected. In this manner, the interval between the mask and the wafer is detected. The reference interval between the gravity centers of the lights 61 (62) and 63 in the X direction as assumed when the correct interval $d_R$ is established, can be detected in preparation from the design values of the marks, for example.

Where the focal length $f_a$ of the condensing lens 207a is 30 mm, and $d_G = 50$ microns, $d_M = 30$ microns and $f_M = 1000$ microns, then from equation (10) the sensitivity $\Delta S$ in this embodiment is such as follows:

$$\Delta S = 30000/1000 \cdot 30/50 = 18 \text{ (microns/microns)}$$

Thus, for each change of 1 micron in the gap between the mask 1 and the wafer 2, the light (spot) on the light receiving means 11 surface is displaced by 18 microns. When a PSD having a position resolution of 0.3 micron is used as the light receiving means 11, in principle, the gap between the mask 1 and the wafer 2 can be measured with a resolution not greater than 0.02 micron. 7 In this embodiment, the condensing lens 17 is disposed in front of the light receiving means 11 of the measuring system. However, the lens 17 may be omitted. In that case, where the distance from the physical optic element 5a of the mask 1 to the light receiving means 12 is denoted by la, in equations (8), (9) and (10) $f_a = l_a$, so it is possible to determine in preparation the displacement S of the inputted light and the sensitivity $\Delta S$.

Next, the function of the correcting system shown in FIG. 10 will be explained.

Light 21b is incident on the physical optic element 4b provided on the mask 1, for light reception. The physical optic element 4b has such optical characteristics that, when parallel light is incident thereon, it emits a diffraction light at a certain deflection angle in accordance with the angle of incidence of the light, but independently of the position of incidence of the light.

Details of the correcting system will be explained.

Light 21b emanating from the semiconductor laser LD is incident with inclination on the grating 4b, at a predetermined angle with respect to a normal to the mask surface, as illustrated in the drawing. Of the transmissive and reflective diffraction rays caused in response thereto, positive first order reflective diffraction light 63 is received by the light receiving means 12 provided within an optical pickup head (not shown). The grating 4b is formed by a pattern of rectilinear grating parallel to an X axis of an orthogonal coordinate system having its X axis extending in the lengthwise direction of a rectangular interval measuring mark region and having its Y axis extending in the widthwise direction of the mark region.

Figure 11A:
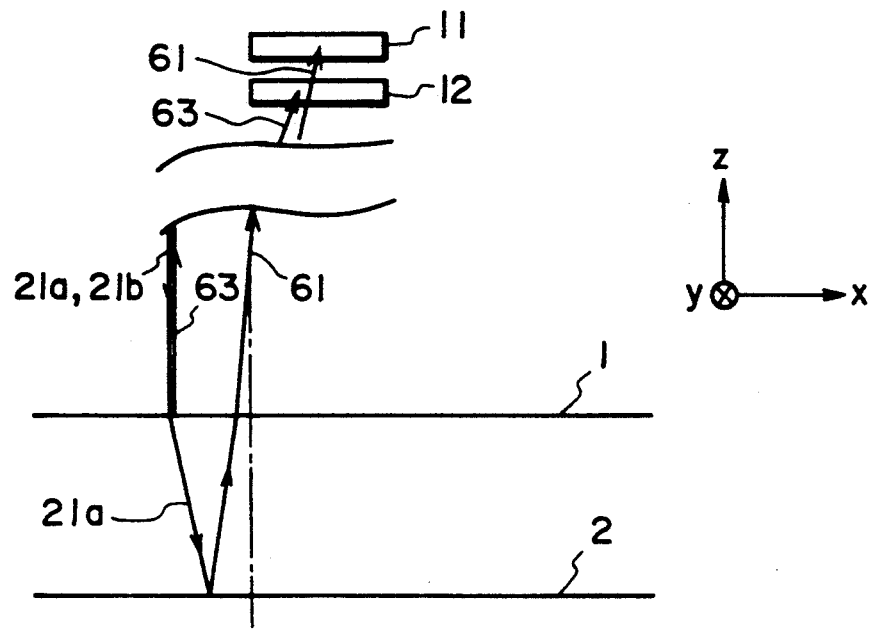
FIGS. 11A and 11B are schematic representations of optical paths in the fifth embodiment.
Figure 11B:
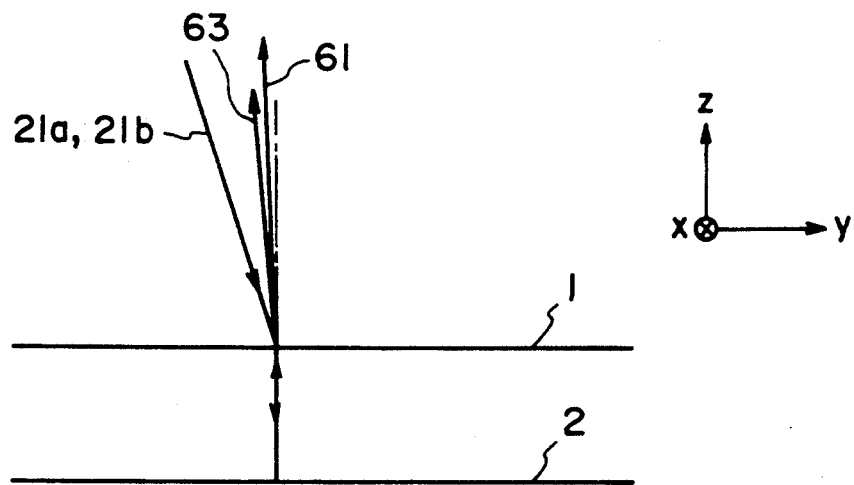

FIGS. 11A and 11B show the optical path of the light 21b, in an X-Z section and in a Y-Z section, respectively. As seen in FIG. 11A, the light spot position detecting direction of the reference-light receiving means 12 is parallel to the X axis and agrees with the light spot position detecting direction of the measuring-light receiving means 11.

The function of the reference light 21b in the correcting system will now be explained.

The reference light 21b can be used to correct any error in the measurement of the interval, due to any shift of the optical pickup head 20 which accommodates therein the light source LD, the light receiving means 11 and 12 and the like, or due to any change in the angle (attitude) of the alignment head relative to the mask, as resulting from the replacement of the mask, for example. More specifically, the lights 61 (62) and 63 travel along respective optical paths having substantially the same length and impinge on the sensor surfaces 11 and 12 which are parallel to each other. In practical measurement of the mask-to-wafer interval, the light 61 (62) is substantially parallel to the light 63. As a result, even if the inclination of the optical pickup head causes a change in the angle of emission between the light 61 (62) and the light 63, the amount of displacement of the position of the center of gravity of the light 61 (62) on the sensor 11 surface is equal to that of the light 63 on the sensor 12 surface. For detection of the interval, the spacing in the X direction between the positions of the gravity centers on the sensors 11 and 12 is detected and, then, any error of the detected spacing with respect to a reference spacing is substituted into equation (9), whereby the mask-to-wafer interval is detected. In this manner, it is possible to assure the interval detection without being affected by any relative inclination of the optical pickup head to the mask.

The physical optic element 5a of the correcting system may have the function of a lens element. For example, when a grating lens having a focal length corresponding to the distance to the sensor surface is used, with the condensing function of such a lens it is possible to increase the density of the intensity distribution of the interval detecting light upon the sensor to thereby improve the signal-to-noise ratio.

While the invention has been described with reference to the structures disclosed herein, it is not confined to the details set forth and this application is intended to cover such modifications or changes as may come within the purposes of the improvements or the scope of the following claims.

What is claimed is:

1. A method of detecting the relative position of first and second objects, comprising the steps of:
   providing the first object with an alignment pattern having an optical power and a reference pattern;
   providing the second object with an alignment mark having an optical power;
   illuminating the first and second objects with light whereby a first beam is produced as a result of passage of light through the alignment pattern of the first object and reflection of the light by the alignment mark of the second object and under the influence of the optical powers of both of the alignment pattern and the alignment mark, and a second beam is produced as a result of the reflection of light by the reference pattern of the first object, wherein the first and second beams travel along different light paths; and
   detecting the position of the second object relative to the first object, on the basis of the position of incidence of each of the first and second beams upon a predetermined plane.

2. A method according to claim 1, wherein each of the alignment pattern and the alignment mark comprises a zone plate pattern.

3. A method according to claim 2, wherein the reference pattern comprises a zone plate pattern which is arranged so that said illuminating step comprises the step of convergently projecting the second beam on the predetermined plane.

4. A method according to claim 1, wherein the first object is a mask and the second object is a wafer.

5. A method of detecting a gap between first and second objects, comprising the steps of:
   providing the first object with an input pattern, an output pattern having an optical power, and a reference pattern;
   illuminating the first and second objects with light whereby a first beam is produced as a result of reception of light by the input pattern, oblique incidence and subsequent reflection of the light from the input pattern upon and by the surface of the second object, and deflection of the reflected light by the output pattern, while a second beam is produced as a result of the reflection of light by the reference pattern of the first object, wherein the first and second light beams travel along different light paths; and detecting the gap between the first and second objects on the basis of the position of incidence of each of the first and second beams upon a predetermined plane.

6. A method according to claim 5, wherein the output pattern comprises a zone plate pattern.

7. A method according to claim 6, wherein the reference pattern comprises a grating pattern.

8. A method according to claim 7, wherein the reference pattern comprises a zone plate pattern which is arranged so that said illuminating step comprises the step of convergently projecting the second beam on the predetermined plane.

9. A method according to claim 7, wherein the input pattern comprises a grating pattern.

10. A method according to claim 5, wherein the first object is a mask and the second object is a wafer.

11. A method of aligning first and second objects, comprising the steps of:
providing the first object with an alignment pattern having an optical power and a reference pattern;
providing the second object with an alignment mark having an optical power;
illuminating the first and second objects with light whereby a first beam is produced as a result of passage of light through the alignment pattern of the first object and the reflection of the light by the alignment mark of the second object and under the influence of the optical powers of both of the alignment pattern and the alignment mark, and a second beam is produced as a result of reflection of light by the reference pattern of the first object, wherein the first and second beams travel along different light paths;
detecting the position of the second object relative to the first object, on the basis of the position of incidence of each of the first and second beams upon a predetermined plane; and
adjusting the positional relationship between the first and second objects.

12. A method according to claim 11, wherein each of the alignment pattern and the alignment mark comprises a zone plate pattern.

13. A method according to claim 12, wherein the reference pattern comprises a zone plate pattern which is arranged so that said illuminating step comprises the step of convergently projecting the second beam on the predetermined plane.

14. A method according to claim 11, wherein the first object is a mask and the second object is a wafer.

15. A method of adjusting a gap between first and second objects, comprising the steps of:
providing the first object with an input pattern, an output pattern having an optical power, and a reference pattern;
illuminating the first and second objects with light whereby a first beam is produced as a result of reception of light by the input pattern, oblique incidence and subsequent reflection of the light from the input pattern upon and by the surface of the second object, and deflection of the reflected light by the output pattern, while a second beam is produced as a result of reflection of light by the reference pattern of the first object, wherein the first and second light beams travel along different light paths;
detecting the gap between the first and second objects on the basis of the position of incidence of each of the first and second beams upon a predetermined plane; and
adjusting the gap between the first and second objects.

16. A method according to claim 15, wherein the output pattern comprises a zone plate pattern.

17. A method according to claim 16, wherein the reference pattern comprises a grating pattern.

18. A method according to claim 17, wherein the reference pattern comprises a zone plate pattern which is arranged so that said illuminating step comprises the step of convergently projecting the second beam on the predetermined plane.

19. A method according to claim 17, wherein the input pattern comprises a grating pattern.

20. A method according to claim 15, wherein the first object is a mask and the second object is a wafer.

21. An aligner for aligning a mask and a wafer, wherein the mask is provided with an alignment pattern having an optical power and a reference pattern, while the wafer is provided with an alignment mark having an optical power, said aligner comprising:
illuminating means for illuminating the mask and the wafer with light whereby a first beam is produced as a result of passage of light through the alignment pattern of the mask and reflection of the light by the alignment mark of the wafer and under the influence of the optical powers of both of the alignment pattern and the alignment mark, and a second beam is produced as a result of reflection of light by the reference pattern of the mask, wherein the first and second light beams travel along different light paths;
signal forming means for detecting the position of incidence of each of the first and second beams upon a predetermined plane and for producing, on the basis of the detection, a signal for correction of a positional deviation between the mask and the wafer; and
adjusting means for adjusting the positional relationship between the mask and the wafer in accordance with the correction signal.

22. A method according to claim 21, wherein each of the alignment pattern and the alignment mark comprises a zone plate pattern.

23. A method according to claim 22, wherein the reference pattern comprises a zone plate pattern which is arranged so that the second beam is convergently projected on the predetermined plane.

24. A method according to claim 21, wherein said signal forming means includes first and second detectors, said first detector having a light receiving surface for receiving the first beam and producing a first signal corresponding to the position of incidence of the first beam upon its light receiving surface, said second detector having a light receiving surface for receiving the second beam and producing a second signal corresponding to the position of incidence of the second beam upon its light receiving surface, wherein the first and second signals are used to produce the signal for correction of the positional deviation, and wherein said illuminating means and said first and second detectors are accommodated in a common housing.

25. An aligner for aligning a mask and a wafer, wherein the mask has an input pattern, an output pattern having an optical power, and a reference pattern, said aligner comprising:

illuminating means for illuminating the mask and the wafer with light, whereby a first beam is produced as a result of reception of light by the input pattern, oblique incidence and subsequent reflection of the light from the input pattern upon and by the surface of the wafer, and deflection of the reflected light by the output pattern, while a second beam is produced as a result of reflection of light by the reference pattern of the mask, wherein the first and second light beams travel along different light paths;

signal forming means for detecting the position of incidence of each of the first and second beams upon a predetermined plane and for producing, on the basis of the detection, a signal for correction of an error in a gap between the mask and the wafer; and adjusting means for adjusting the gap between the mask and the wafer, in accordance with the produced signal.

26. An aligner according to claim 25, wherein the output pattern comprises a zone plate pattern.

27. An aligner according to claim 26, wherein the reference pattern comprises a grating pattern.

28. An aligner according to claim 27, wherein the reference pattern comprises a zone plate pattern which is arranged so that the second beam is convergently projected on the predetermined plane.

29. An aligner according to claim 27, wherein the input pattern comprises a grating pattern.

30. An aligner according to claim 25, wherein said signal forming means includes first and second detectors, said first detector having a light receiving surface for receiving the first beam and producing a first signal corresponding to the position of incidence of the first beam upon its light receiving surface, said second detector having a light receiving surface for receiving the second beam and producing a second signal corresponding to the position of incidence of the second beam upon its light receiving surface, wherein the first and second signals are used to produce the signal for correction of the gap error, and wherein said illuminating means and said first and second detectors are accommodated in a common housing.

31. A method of manufacturing a semiconductor device, comprising the steps of:

providing a mask having a circuit pattern, an alignment pattern with an optical power, and a reference pattern;

providing a wafer having an alignment mark with an optical power;

illuminating the mask and the wafer with light whereby a first beam is produced as a result of the passage of light through the alignment pattern of the mask and the reflection of the light by the alignment mark of the wafer and under the influence of the optical powers of both of the alignment pattern and the alignment mark, and a second beam is produced as a result of the reflection of light by the reference pattern of the mask, wherein the first and second beams travel along different light paths;

detecting the position of the wafer relative to the mask, on the basis of the position of incidence of each of the first and second beams upon a predetermined plane;

adjusting the positional relationship between the mask and the wafer; and transferring the circuit pattern of the mask onto the wafer.

32. A semiconductor device manufactured by a method which comprises the steps of:

providing a mask having a circuit pattern, an alignment pattern with an optical power, and a reference pattern;

providing a wafer having an alignment mark with an optical power;

illuminating the mask and the wafer with light whereby a first beam is produced as a result of the passage of light through the alignment pattern of the mask and the reflection of the light by the alignment mark of the wafer and under the influence of the optical pwoers of both of the alignment pattern and the alignment mark, and a second beam is produced as a result of the reflection of light by the reference pattern of the mask, wherein the first and second beams travel along different light paths;

detecting the position of the wafer relative to the mask, on the basis of the position of incidence of each of the first and second beams upon a predetermined plane;

adjusting the positional relationship between the mask and the wafer; and transferring the circuit pattern of the mask onto the wafer.

* * * * *

UNITED STATES PATENT AND TRADEMARK OFFICE
CERTIFICATE OF CORRECTION

PATENT NO. : 5,235,408
DATED : 8/10/93
INVENTOR(S) : Matsugu et al

It is certified that error appears in the above-indentified patent and that said Letters Patent is hereby corrected as shown below:

ON COVER PAGE

At [30], Foreign Application Priority Data

"Sep. 5, 1988 [JP] Japan.....63-221587" should read --September 5, 1988 [JP] Japan.....63-221537--.

At [56], References Cited
U.S. Patent Documents

Insert: --4,398,824 8/1983 Feldman et al.--.

COLUMN 2

Line 28, close right margin.
Line 29, "If" should read --if--; and close left margin.

COLUMN 4

Line 47, "of distance a" should read --a distance of--.
Line 50, "distance" should read --distance of--.

UNITED STATES PATENT AND TRADEMARK OFFICE
CERTIFICATE OF CORRECTION

PATENT NO. : 5,235,408

DATED : 8/10/93

INVENTOR(S) : Matsugu et al

Page 2 of 4

It is certified that error appears in the above-indentified patent and that said Letters Patent is hereby corrected as shown below:

COLUMN 5

Line 16, "$\Delta\delta = \Delta\sigma x(b/a +1)$ (a)" should read --$\Delta\delta = \Delta\sigma \times (b/a +1)$ (a)--.

Line 38, "geometo-optically" should read --geometro-optically--.

COLUMN 6

Line 22, "amount $\Delta\Gamma_1$," should read --amount $|\Delta\theta_1$--.
Line 30, "sensor" should read --sensor is--.
Line 32, "$\Delta x_{g1} 2l \tan \Delta\theta_1$" should read --$\Delta x_{g1}=2\ell \tan \Delta\theta_1$--.
Line 47, "displaced," should read --is displaced,--.
Line 51, "$\Delta x_{g2=}21 \tan \Delta\theta 2$" should read --$\Delta x_{g2}=2\ell \tan \Delta\theta_2$--
Line 66, "(x-z plane)" should read --(X-Z plane)--;

COLUMN 7

Line 26, "as of that" should read --as that--.

COLUMN 9

Line 43, "use" should read --use of--.

UNITED STATES PATENT AND TRADEMARK OFFICE
CERTIFICATE OF CORRECTION

PATENT NO. : 5,235,408
DATED : 8/10/93
INVENTOR(S) : Matsugu et al

It is certified that error appears in the above-indentified patent and that said Letters Patent is hereby corrected as shown below:

COLUMN 10

Line 26, "light" should read --light is--.

COLUMN 12

Line 46, "the" (second occurrence) should read --the same--.

COLUMN 14

Line 22, "of" should be deleted.

COLUMN 15

Line 26, "displaced." should read --is displaced--.

COLUMN 17

Line 14, "an" should read --a--.
Line 23, "lense" should read --lens--.
Line 30, "lense 17." should read --lens 17.--.

UNITED STATES PATENT AND TRADEMARK OFFICE
CERTIFICATE OF CORRECTION

PATENT NO. : 5,235,408
DATED : 8/10/93
INVENTOR(S) : Matsugu et al

It is certified that error appears in the above-indentified patent and that said Letters Patent is hereby corrected as shown below:

COLUMN 19

Line 11, "7" should read --.--.
    Line 12, "In" should begin a new paragraph.

Signed and Sealed this

Seventeenth Day of May, 1994

Attest:

BRUCE LEHMAN

Attesting Officer        Commissioner of Patents and Trademarks